United States Patent
Tseng

(10) Patent No.: US 6,576,537 B2
(45) Date of Patent: Jun. 10, 2003

(54) FLASH MEMORY CELL AND METHOD FOR FABRICATING A FLASH MEMORY CELL

(75) Inventor: Horng-Huei Tseng, Hsinchu (TW)

(73) Assignee: Vanguard International Semiconductor Corp., Hsinchu (TW)

(*) Notice: Subject to any disclaimer, the term of this patent is extended or adjusted under 35 U.S.C. 154(b) by 0 days.

(21) Appl. No.: 09/924,328

(22) Filed: Aug. 8, 2001

(65) Prior Publication Data

US 2003/0032273 A1 Feb. 13, 2003

(51) Int. Cl.⁷ .................. H01L 21/3205; H01L 21/4763
(52) U.S. Cl. .................. 438/594; 438/263; 438/264
(58) Field of Search .................. 438/259, 264, 438/266, 589, 594, 637, 263, 639

(56) References Cited

U.S. PATENT DOCUMENTS 6,294,812 B1 * 9/2001 Ding et al.

* cited by examiner

Primary Examiner—David Nelms
Assistant Examiner—Phuc T. Dang
(74) Attorney, Agent, or Firm—J.C. Patents

(57) ABSTRACT

In a method for fabricating a memory cell, a gate stack on a substrate comprises a tunneling dielectric layer, a first conductive layer and a cap layer. Source and drain regions are formed in the substrate adjacent to the gate stack, and spacers are formed on the sidewalls of the gate stack. A plurality of isolation structures are formed through the source/drain regions concurrently to a removal of the cap layer. A second conductive layer is formed over the first conductive layer. By down setting the isolation structures and patterning the second conductive layer over the isolation structures, the patterned second conductive layer is conformal to the profile of the first conductive layer and the spacers by wrapping around the spacers, and extends over the isolation structures. The surface area of the floating thereby formed is increased, which increase the capacitive-coupling ratio.

16 Claims, 5 Drawing Sheets

FLASH MEMORY CELL AND METHOD FOR FABRICATING A FLASH MEMORY CELL

BACKGROUND OF THE INVENTION

1. Field of the Invention

The invention relates to flash memory. More particularly, the present invention relates to a flash memory structure with increased capacitive-coupling ratio and a method for fabricating the flash memory.

2. Description of the Related Art

Nonvolatile memory devices are extensively used in modern electronic equipment to store data. Recently, "Flash" memory devices, a particular type of semiconductor nonvolatile memory, have been increasingly developed and used in portable equipment such as hand-held computers or digital still cameras.

Because electronic products evolve to miniaturized devices with higher density, flash memory devices consequently must be denser and have high capacitive-coupling ratio. Increasing the storage capacity of the flash memory requires a reduction in the size of the memory cell to improve its density. This reduction is conventionally accomplished by decreasing the gate length of the memory cell as well as the data line pitch. However, a minimum lithographic feature size imposed by lithographic processes during the manufacture of the flash memory conventionally limits this dimensional reduction.

On the other hand, high capacitive-coupling ratio is required because it allows for lower internal voltage operation. However, a high capacitive-coupling ratio may be contradictory with the requirement to have denser memory device because a reduction of the gate length decreases the surface area of the floating gate and consequently the capacitive-coupling ratio of the memory cell.

A method for fabricating a flash memory cell know in the art is described hereafter. The flash memory is fabricated from a conventional a gate stack. The conventional gate stack comprises a tunneling oxide layer, first floating gate layer, polysilicon layer, insulating layer, spacer polysilicon layer and cap layer successively formed and patterned on a substrate. Source/drain regions are formed in the substrate adjacent to the gate structure. A pair of spacers are formed on the sidewalls of the gate stack and on the source/drain regions. Isolation structures are fabricated by filling a plurality of trenches formed through the source/drain regions with chemical vapor deposition (CVD) of silicon dioxide and boron phosphosilicate glass (BPSG). The cap layer, spacer polysilicon, and insulating layer then are removed and a second floating gate layer is formed on the first floating gate layer. By providing a 3D-shaped second floating gate layer, the capacitive-coupling ratio of the floating gate, constituted of the first and second floating gate layers, is increased.

The foregoing method is complex because it requires numerous steps, and the capacitive-coupling ratio still can be improved.

SUMMARY OF THE INVENTION

An aspect of the present invention is to provide a method for fabricating a memory cell having increased capacitive-coupling ratio.

To accomplish at least the above objectives, the present invention provides a method for fabricating a memory cell that comprises the following steps. A gate stack is formed on a substrate, the gate stack comprises a stack of tunneling dielectric layer, first conductive layer, and a cap layer. Source and drain regions are formed in the substrate adjacent to the gate stack. A plurality of spacers are formed on sidewalls of the gate stack. A portion of the substrate is selectively removed to form a plurality of trenches through the source and drain regions. A first dielectric layer is formed over the substrate to fill the trenches. In an embodiment, material of the first dielectric is for example the same as the material of the cap layer and different from the material of the spacers. The first dielectric layer and the cap layer thus can be concurrently removed by a selective etching until the first conductor layer is exposed. As a result, a plurality of trench isolation structures are formed with a down set surface. In another embodiment, the first dielectric layer and the cap layer are necessary to be the same material and are independently removed. As a result, the cap layer is removed and a top portion of the first dielectric layer filled in the trench is removed. A second conductive layer is blanket deposited over the substrate and patterned, such that the patterned second conductive layer extends over the isolation structures but separates from the adjacent one. Due to the down set surface of the trench isolation structures, the second conductive layer extends over the outer side surface of the spacer to the surface of the trench isolation structure. The surface area of the floating gate, which includes the first conductive layer and the patterned second conductive layer, is hence increased. A second dielectric layer and a third conductive layer are sequentially formed over the substrate, wherein the third conductive layer forms a control gate.

The present invention further provides a memory cell structure that increases the capacitve-coupling ratio. The memory cell structure of the present invention comprises the following elements. A gate stack on a substrate comprises a tunneling dielectric and a floating gate. Source/drain regions are located in the substrate, adjacent to the gate stack. A plurality of spacers are formed on the sidewalls of the gate stack and on the source/drain regions. An isolation structure located in the substrate to isolate the gate stack, wherein the isolation structure is also raised up to the spacers but is lower than the top of the spacers. A conductive layer is located over a topographic surface over the floating gate, an exposed portion of the spacer, and a portion of the trench isolation structure. As a result, the conductive layer serve together with the floating gate. The conductive layer increases the effective area of the floating gate and therefore at least increase the capacitive-coupling ratio.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
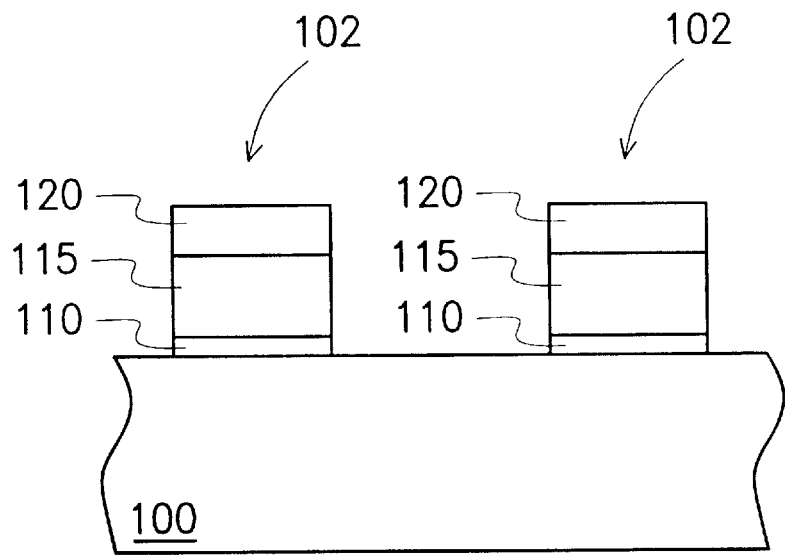
FIG. 1 through FIG. 10 are cross-sectional views schematically illustrating various stages in the manufacturing process of a memory cell according to embodiments of the present invention.

The following detailed description of the embodiments and examples of the present invention with reference to the accompanying drawings is only illustrative of specific ways to implement the invention, and does not limit the scope of the invention. Like reference numerals in the different figures refer to like elements unless otherwise indicated.

In the following description, the terms "spacers" and "sidewall spacers" are related to each other and are interchangeably used. Sidewall spacers refer to spacers that are formed on the surfaces of the gate stack shown substantially perpendicular to the substrate in the drawings. The term "substrate" means any base support on which can be formed memory cells. A substrate can include, for example, a silicon wafer.

Referring now to FIG. 1, a cross-sectional view of a substrate schematically illustrates an intermediary starting point in the manufacturing process of a memory cell according to an embodiment of the present invention. A substrate 100 is provided with a plurality of gate stacks 102 formed thereon. Each of the gate stacks 120 comprises a tunneling dielectric layer 110, a first conductive layer 115, and a cap layer 120.

The gate stacks 120 are formed by, for example, successively forming a thin oxide layer 110 serving as a tunneling dielectric layer on the silicon substrate 100, depositing a polysilicon layer 115 serving as a first conductive layer on the thin oxide layer, and depositing a cap layer 120 on the polysilicon layer. The polysilicon layer 115 can be, for example, doped, wherein the doping impurities are in-situ doped into the polysilicon layer 115, for example. In general, the polysilicon layer is a conductive layer includes, for example, polysilicon, amorphous silicon, where polysilicon is preferred. In an example of implementation, the first conductive layer 115 is approximately within a range of 500 angstroms to 4000 angstroms thick, and the cap layer 120 is approximately within a range of 500 angstroms to 3000 angstroms thick. The thin oxide layer 110, the polysilicon layer 115, and the cap layer 120 then are patterned to form the gate stacks 102.

Figure 2:
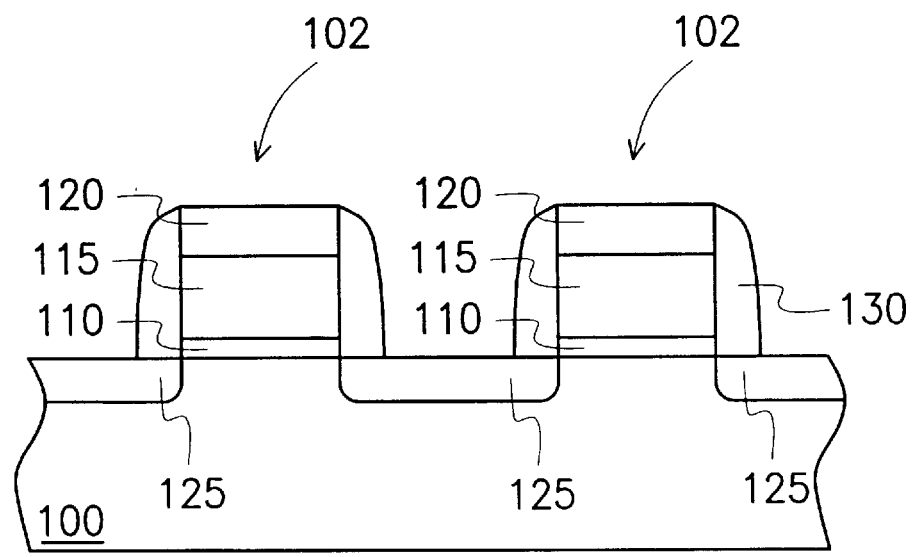

Referring to FIG. 2, an ion implantation is performed to form source/drain regions 125 in the substrate 100 adjacent to the gate stacks 102. The source/drain regions 125 are formed by, for example, a heavy implantation of arsenic ions in the substrate 100. Spacers 130 are formed on the sidewalls of each of the gate stacks 102 and on the source/drain regions 125.

The spacers 130 can be formed by first depositing a dielectric layer, for example an oxide or preferably a nitride layer, over the substrate 100. The dielectric layer then is etched back to form the spacers 130.

Figure 3:
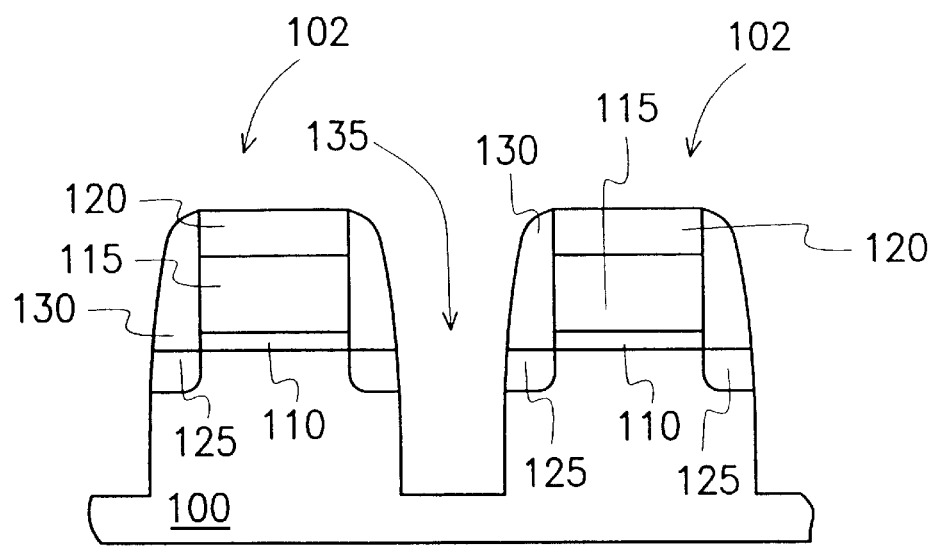

Referring to FIG. 3, an anisotropic etching process is performed on the substrate 100, using the cap layer 120 and the spacer 130 as a mask, so as to form a plurality of trenches 135 through the source/drain regions 125 in the substrate 100 between two adjacent gate stacks 102. The trenches 135 are has self-aligned property due to using the cap layer 120 and spacers 130 as the etching mask. As a result, a limitation of the width of the trench 135 under the lithographic technology can be further reduced, and therefore the width of the isolation structures to be formed can be reduced.

Figure 4:
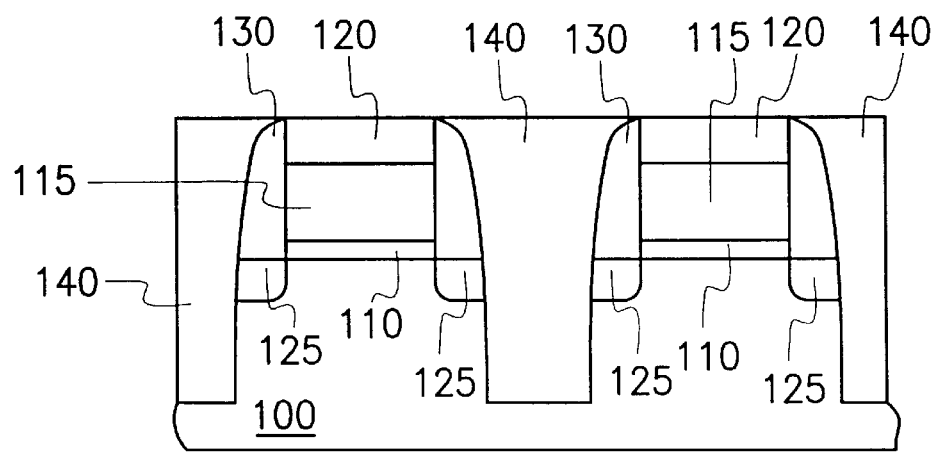

Referring to FIG. 4, the trenches 135 are filled with a dielectric material to form isolation structures 140. The isolation structures 140 are formed through the source/drain regions 125 and contiguous to a sidewall of the spacers 130 within the trench 135. The trench isolation structure is also called a raised trench isolation structure.

The isolation structures 140 are formed by, for example, first depositing a dielectric material over the substrate 100, which fills up the trenches 135. The dielectric material that fills up the trenches 135 is made of oxide, nitride or other materials known as dielectric material, the constraint imposed is that it is different from the material that forms the spacers 130. In an example of processing to form the isolation structures 140, the dielectric material can be removed by, for example, a chemical mechanical polishing (CMP) until the cap layer 120 is exposed, the cap layer thus typically should be made of CMP-resistant material. Alternately, the dielectric layer can be simply etched back to form the isolation structures 140.

Figure 5:
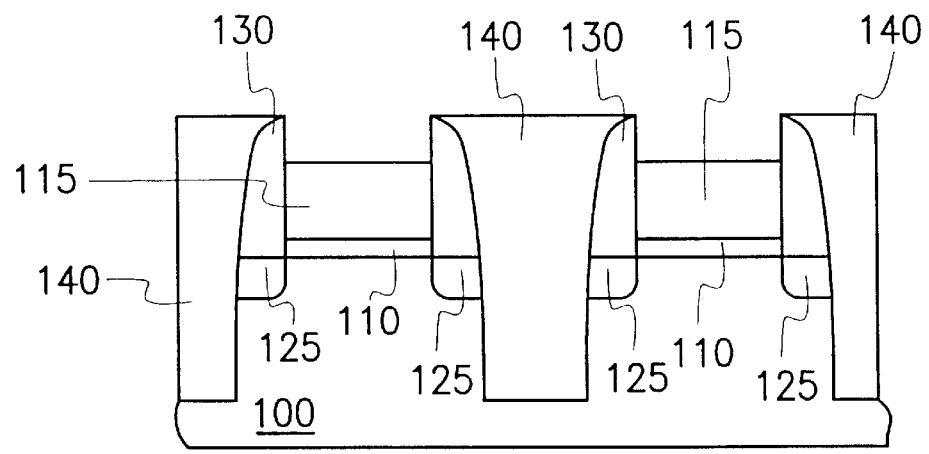

Referring to FIG. 5, the cap layer 120 (shown in FIG. 4) is removed. The cap layer 120 can be removed by, for example, a selective etching back until the first conductor layer 115 is exposed.

Figure 6:
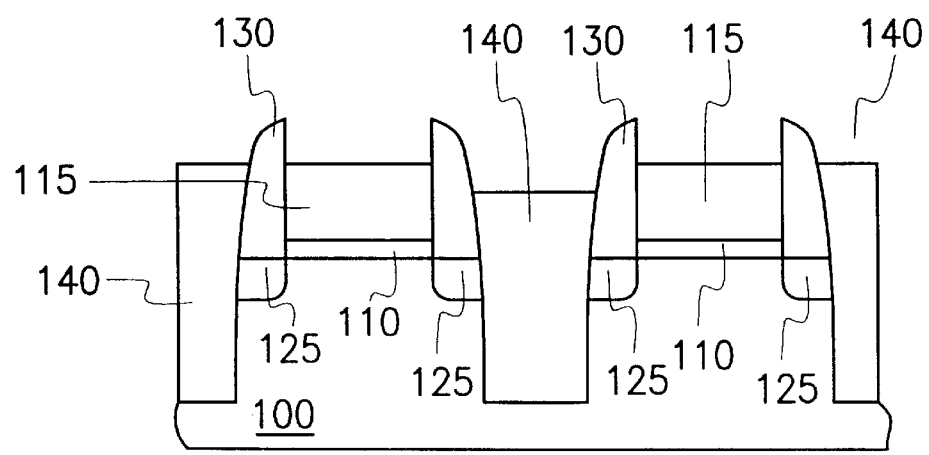

Referring to FIG. 6, the isolation structures 140 are partially etched such that the top of the isolation structures 140 is down set from, for example, the top of the spacers 130. Since the material of the isolation structures 140 is different from the material of the spacers 130, the isolation structures 140 can be selectively etched away.

In the above description, the formation of the isolation structures 140 and the removal of the cap layer 120 are performed independently from each other without requirement of specific order of operation. However, these two processes also can be performed concurrently as described hereafter with reference to FIG. 7 and FIG. 8.

Figure 7:
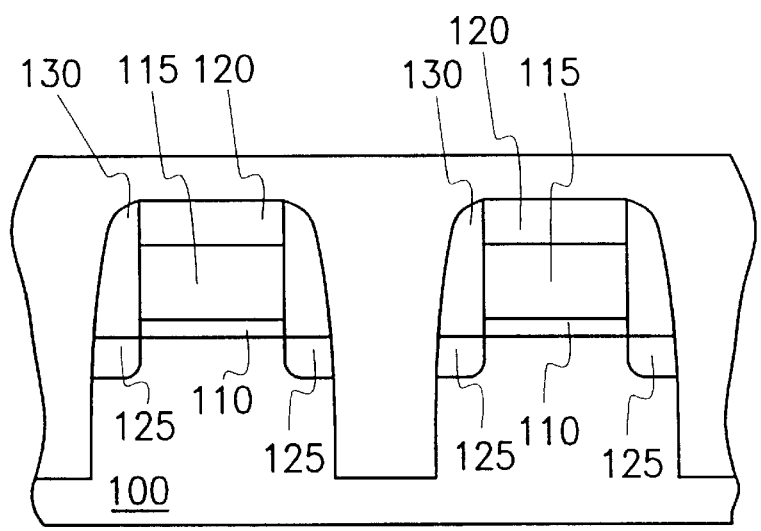
Figure 8:
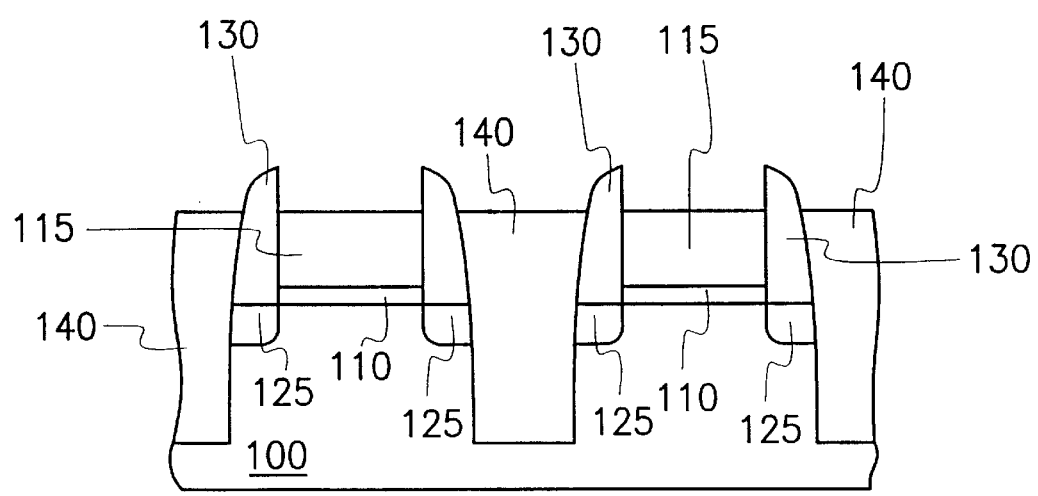

Referring to FIG. 7 and FIG. 8 that illustrate another embodiment of the present invention, the dielectric material that forms the isolation structures 140 is identical to the material of the cap layer 120 (for example oxide), and different from the material of the spacers 130 (for example nitride). After being deposited over the substrate 100 to fill up the trenches 135, the dielectric material that forms the isolation structures is removed by a selective etching back. Because the dielectric material of the isolation structures 140 is identical to the material of the cap layer 120 and different from the material of the spacers 130, the cap layer 120 thus can be subsequently removed concurrent to the removal of the dielectric material during the selective etching back. The selective etching back is performed until the first conductive layer 115 is exposed, which forms down-set isolation structures 140, as shown in FIG. 8.

In general, the materials of the cap layer 120, the spacers 130, and the isolation structure 140 can be chosen, so as to have the etching selectivity on the cap layer 120 and the isolation structure 140 with respect to the spacers 130. Then, the cap layer 120 and the dielectric material for the isolation structure 140 can be concurrently etched without etching the spacers 130.

Figure 9:
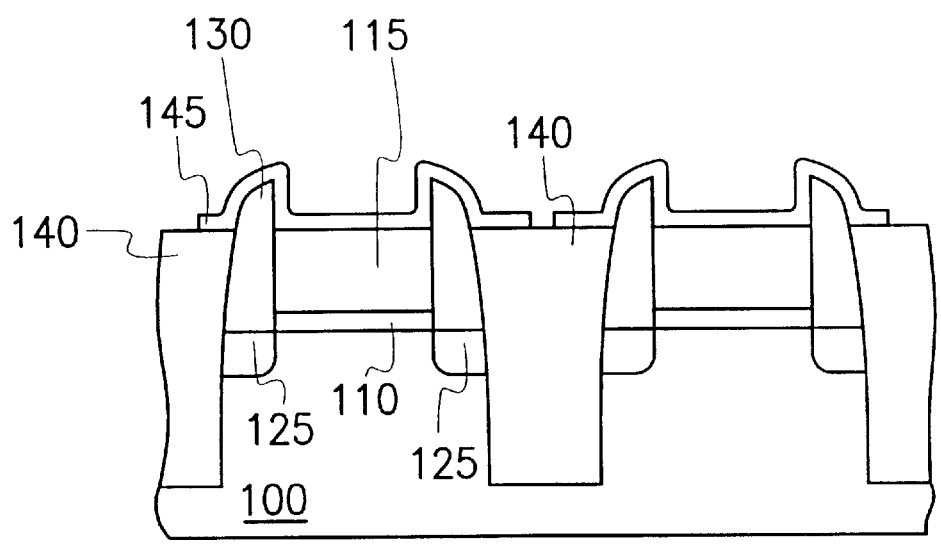

Referring to FIG. 9, a floating gate (115+145) with increased surface area is formed. This floating gate structure can be formed by first forming a second conductive layer over the substrate 100. The second conductive layer can include, for example, polysilicon or amorphous silicon blanket deposited with a thickness approximately with a range of 100 angstroms to 1000 angstroms. The second conductive layer then is patterned, for example by means of conventional lithography and plasma etching processes, to form a conformal conductive layer 145. The conductive layer is substantially conformal to the outer profile of the gate structure comprising the tunneling oxide 110, the first conductive layer 115, and the spacers 130. The first conductive layer 115 and the conformal conductive layer 145 hence form the floating gate (115+145) with increased surface area. The conductive layer 145 extends to a portion of the isolation structure 140 but is separated from an adjacent conductive layer.

Figure 10:
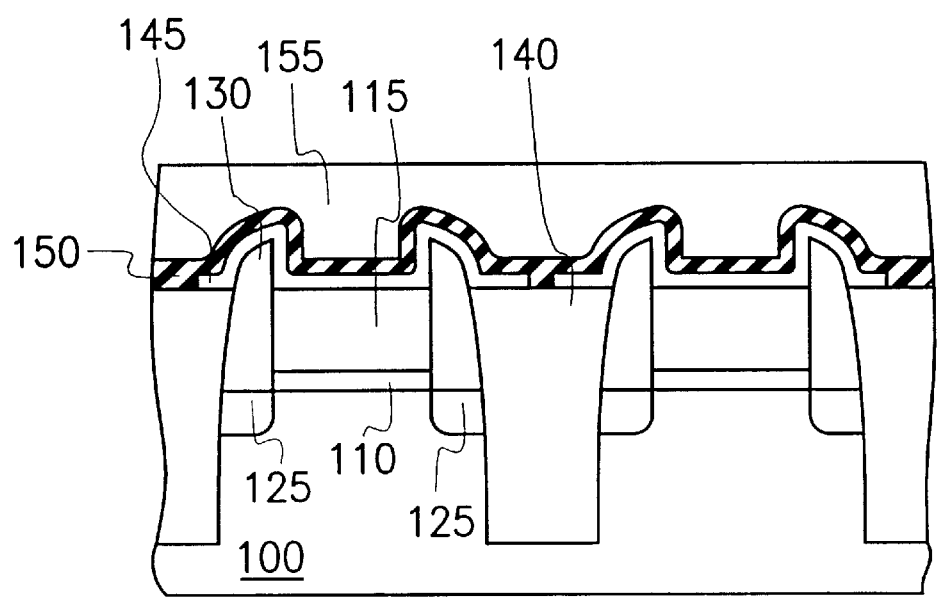

Referring to FIG. 10, a thin dielectric layer 150 is blanket deposited over the substrate 100. The thin dielectric layer 150 can include, for example, a stack of nitride/oxide (NO), or oxide/nitride/oxide (ONO). A third conductive layer 155, made of, for example, polysilicon, amorphous silicon, doped polysilicon, polycide or metal, then is formed over the thin dielectric layer 150 to form a control gate.

As shown in FIG. 10, the structure of the memory cell of the present invention has a floating gate (115+145) of which the surface area is advantageously increased. The surface area of the floating gate is increased by forming the gate-structure-conformal conductive layer 145 such that it is conformal to the outer profile of the first conductor layer 115 and sidewall spacers 130 (by wrapping around the sidewalls spacers 130), and extends over the isolation structures 140. Increasing the surface area of the floating gate favorably results in an increase of the capacitive-coupling ratio of the memory cell.

In conclusion, the present invention provides a flash memory cell in which the surface area of the gate structure floating gate is substantially increased, which advantageously results in an increase of the capacitve-coupling ratio of the memory cell. The present invention also provides a method for fabricating a memory cell having increased capacitive-coupling ratio that needs less manufacturing steps in comparison with the conventional method.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a memory cell on a substrate, wherein a gate stack having a tunneling dielectric, a first conductive layer and a cap layer is formed on the substrate, and the first conductive layer includes one layer selected from the group consisting of a polysilicon layer and an amorphous silicon layer, the method comprising:

forming source/drain regions in the substrate adjacent to the gate stack;

forming a plurality of spacers on sidewalls of the gate stack;

selectively etching the substrate to form a trench using the spacers and the gate stack as a mask;

forming a first dielectric material layer over the substrate to fill the trench;

removing a top portion of the first dielectric material layer, wherein a remaining portion of the first dielectric material layer forms a plurality of isolation structures with a down set level from a top of the spacers;

removing the cap layer;

forming a patterned second conductive layer on the first conductive layer, wherein the patterned second conductive layer extends over a portion of the isolation structures;

forming a second dielectric layer over the substrate; and forming a control gate over the second dielectric layer.

2. The method of claim 1, wherein the patterned second conductive layer is a conformal conductive layer that covers the first conductor layer, wraps a top portion of the spacers, and is patterned for separation at a top surface of the isolation structures.

3. The method of claim 1, wherein a material of the spacers is different from a material of the first dielectric material layer and a material of the cap layer.

4. The method of claim 1, wherein the first conductive layer includes one selected from the group consisting of a polysilicon layer and an amorphous silicon layer having a thickness approximately within a range of 500 angstroms to 4000 angstroms.

5. The method of claim 1, wherein the thickness of the cap layer is approximately within a range of 500 angstroms to 3000 angstroms.

6. The method of claim 1, wherein the thickness of the second conductive layer is approximately within a range of 100 angstroms to 1000 angstroms.

7. The method of claim 1, wherein the second dielectric layer includes nitride/oxide (NO) or oxide/nitride/oxide (ONO).

8. A method for fabricating a memory cell on a substrate, wherein a gate stack comprising a tunneling dielectric layer, a first conductive layer and a cap layer is formed on the substrate, and the first conductive layer includes one layer selected from the group consisting of a polysilicon layer and an amorphous silicon layer, the method comprising:

forming source/drain regions in the substrate adjacent to the gate stack;

forming a plurality of spacers on sidewalk of the gate stack; etching the substrate to form a plurality of trenches in the substrate using the spacers and the gate stack as a mask;

forming a first dielectric layer over the substrate to fill the trenches;

concurrently removing a top portion of the first dielectric layer and the cap layer, wherein the first conductive layer is exposed, and a remaining portion of the first dielectric layer fills the trenches to form isolation structures with a top surface lower than a top of the spacers;

forming a patterned second conductive layer on the first conductive layer, wherein the patterned second conductive layer also extends over the isolation structures;

forming a second dielectric layer over the substrate; and forming a control gate over the second dielectric layer.

9. The method of claim 8, wherein in the step of concurrently removing a top portion of the first dielectric layer and the cap layer, materials of the cap layer, the first dielectric layer, and the spacers are chosen so that an etching selectivity on the spacers with respect to the cap layer and the first dielectric layer can be set.

10. The method of claim 8, wherein the first dielectric layer and the cap layer are concurrently removed by a selective etching.

11. The method of claim 8, wherein the a top surface of the isolation structures is lower than a top surface of the conductive layer.

12. The method of claim 8, wherein the patterned second conductive layer is a conformal layer that covers the first conductive layer, wraps around a top portion of the spacers, and is separated from another next conductive structure at a top surface of the isolation structures.

13. The method of claim 8, wherein the first conductive layer includes one selected from the group consisting of a doped polysilicon layer and an amorphous silicon layer, having a thickness approximately within a range of 500 angstroms to 4000 angstroms.

14. The method of claim 8, wherein the thickness of the cap layer is approximately within a range of 500 angstroms to 3000 angstroms.

15. The method of claim 8, wherein the thickness of the patterned second conductive layer is approximately within a range of 100 angstroms to 1000 angstroms.

16. The method of claim 8, wherein the second dielectric layer includes nitride/oxide (NO) or oxide/nitride/oxide (ONO).

* * * * *